United States Patent [19]

Spletter et al.

[11] Patent Number: 5,049,718
[45] Date of Patent: Sep. 17, 1991

[54] METHOD OF LASER BONDING FOR GOLD, GOLD COATED AND GOLD ALLOY COATED ELECTRICAL MEMBERS

[75] Inventors: Philip J. Spletter, Cedar Park; Colin A. Mackay; Claire T. Galanakis, both of Austin; John C. Parker, Round Rock, all of Tex.

[73] Assignees: Microelectronics and Computer Technology Corporation, Austin, Tex.; Digital Equipment Corporation, Maynard, Mass.

[21] Appl. No.: 558,127

[22] Filed: Jul. 25, 1990

Related U.S. Application Data

[63] Continuation-in-part of Ser. No. 405,377, Sep. 8, 1989.

[51] Int. Cl.$^5$ .............................................. B23K 26/00
[52] U.S. Cl. ............................ 219/121.64; 219/121.85
[58] Field of Search ...................... 219/121.63, 121.64, 219/121.85

[56] References Cited

U.S. PATENT DOCUMENTS

| | | | |
|---|---|---|---|
| 4,023,005 | 5/1977 | Bolin | 219/121.85 |
| 4,320,281 | 2/1982 | Cruickshank et al. | 219/121.64 |
| 4,330,699 | 5/1982 | Farrow | 219/121.64 |
| 4,331,518 | 5/1982 | Wilson | 204/43 |
| 4,341,942 | 7/1982 | Chaudahari et al. | 219/121.64 |
| 4,348,263 | 9/1982 | Draper et al. | 204/29 |
| 4,394,711 | 7/1983 | Conley | 361/408 |
| 4,404,453 | 9/1983 | Gotman | 219/121.64 |
| 4,471,204 | 9/1984 | Takafuji et al. | 219/121.64 |
| 4,495,255 | 1/1985 | Draper et al. | 428/669 |
| 4,530,875 | 7/1985 | Donomoto et al. | 428/283 |
| 4,534,811 | 8/1985 | Ainslie et al. | 156/73.1 |
| 4,535,219 | 8/1985 | Silwa, Jr. | 219/121.63 |
| 4,587,395 | 5/1986 | Oakley et al. | 219/121.64 X |
| 4,691,092 | 9/1987 | Verburgh et al. | 219/121.64 |
| 4,697,061 | 9/1987 | Spater et al. | 219/121.64 |
| 4,727,246 | 2/1988 | Hara et al. | 235/488 |
| 4,749,626 | 6/1988 | Kadija et al. | 428/627 |
| 4,845,335 | 7/1989 | Andrews et al. | 219/121.63 |
| 4,926,022 | 5/1990 | Freedman | 219/121.64 X |

OTHER PUBLICATIONS

Burns et al., "Laser Microsoldering", Apollo Lasers, Inc., Los Angeles, Calif., pp. 115–124.
Avramchenko et al., "The Pulsed Laser Welding of Conductors to Films in the Manufacturing of Micro Devices", Avt. Svarka, No. 5, pp. 20–21, 1978.
Okino et al., "Yag Laser Soldering System for Fine Pitch Quad Flat Package (QFP)", IEEE, pp. 152–156, 1986.
Lish, "Application of Laser Microsoldering to Printed Wiring Assemblies", Institute for Interconnecting and Packaging Electronic Circuits, IPC-TP-538, IPC 28th Annual Meeting, Apr. 1985.
MacKay et al., "Solder Sealing Semiconductor Packages", IEEE Transactions on Components, Hybrids, and Manufacturing Technology, vol. CHMT-9, No. 2, Jun. 1986.

*Primary Examiner*—C. L. Albritton
*Attorney, Agent, or Firm*—David M. Sigmond

[57] ABSTRACT

A method is disclosed for laser bonding two highly reflective electrical members. The first electrical member is coated with a coating alloy containing the metal of the second electrical member and a coupling material that is well absorbent of laser energy at the laser beam wavelength, has a lower melting point than either of the electrical members, and has a low solubility in a solid bond alloy of the electrical members. The laser characteristics are selected so that as bonding occurs a bond alloy of the electrical members solidifies and a solidification front drives the molten coupling material away from the bond interface toward the exterior periphery of the bond, so that substantially all of the solidified bond interface and bond interface strength results from the bond alloy. Coating a copper lead with a coating alloy containing gold and a coupling material, and then contacting the coated copper lead with a gold bonding pad provides for gold-to-gold TAB tape laser bonding.

21 Claims, 8 Drawing Sheets

METHOD OF LASER BONDING FOR GOLD, GOLD COATED AND GOLD ALLOY COATED ELECTRICAL MEMBERS

CROSS-REFERENCE TO RELATED APPLICATIONS

This application is a continuation-in-part of U.S. Ser. No. 07/405,377, filed Sept. 8, 1989 and entitled "Method of Laser Bonding Electrical Members."

BACKGROUND OF THE INVENTION

The present invention is directed to using laser bonding to connect two electrical members together which are gold, gold coated or gold alloy coated. In particular the present invention is advantageous in inner lead bonding of a tape automated bonding (TAB) tape to the electrical bumps on an integrated circuit die, such as semiconductors. Thermal compression bonding, the current industry standard for inner lead bonding, uses 15,000 psi pressures and 400° C. temperatures which would have a damaging effect if leads were bonded to bonding pads or bumps coated over semiconductor structures, especially as the bonding pads become more miniaturized. Further, thermal compression bonding is commonly optimized to one specific integrated circuit type and different sized circuits require a different set of tooling which is time consuming to replace and re-optimize. In addition the thermode must be cleaned periodically resulting in decreased system throughput. Thermosonic bonding is also well known, but suffers the drawback that the ultrasonic energy can damage the materials, the speed is limited, and the resolution may not be sufficient for closely pitched bonds.

It is well known that highly reflective metals are difficult to laser bond since laser irradiation occurs in the visible and near-visible regions of the spectrum. For $CO_2$ lasers, this reflectivity is traditionally overcome by coating the metals to be joined with an organic material, such as flux, that absorbs the energy and transfers the heat via thermal conduction. The use of additional coating that must be removed after bonding is undesirable, particularly on devices that have close pitches which makes thorough cleaning difficult. Failure to clean residual organics can degrade the reliability of the circuit. Several solutions have been proposed. U.S. Pat. No. 4,023,005 discloses a method of welding highly reflective metallic members wherein one member is coated with a metal skin of nickel or palladium with low reflectivity to enable welding by a laser. The metal skin is chosen which will not vaporize and as the molten alloy of the metallic members cools a weld nugget alloy is formed containing metal from the metal skin as well as the metallic members. Likewise, U.S. Pat. No. 4,697,061 discloses a method for laser welding a highly reflective covering to a base layer wherein both the covering and the base layer are covered with a metal skin of solder that is less highly reflective of the laser. Each of these prior art techniques, however, suffers the drawback that intermetallics containing the low reflectivity metal and the highly reflective metals occur at the bond interface. At this location these intermetallics can cause reliability problems, especially if the bond is subject to thermal cycling, thermal shock, or mechanical shock. In the case of copper/gold bonds, a tin coating may form brittle intermetallic compounds throughout the entire bond interface.

Furthermore, there are no known satisfactory microelectronic laser bonding techniques for bonding gold, gold coated or gold alloy coated electrical members. Gold-to-gold bonds can be fabricated with thermal compression or thermosonic bonding instruments, but with the drawbacks as previously described. Microelectronic laser bonding typically employs coating tin on a member prior to bonding in order to absorb sufficient laser energy to fuse or weld a bond; see, for instance, U.S. Pat. No. 4,697,061 entitled "Method For Welding By Means of Laser Light." However the use of tin coatings can severly limit shelf life due to drawbacks like tin whiskers, phase changes, oxidation, and development of a reaction layer which consumes free tin. These tin drawbacks are particularly applicable to copper and copper base alloy substrates due to interdiffusion and formation of copper-tin compounds. As a copper substrate ages in storage, the thickness and uniformity of free tin can be reduced as free tin is replaced by a duplex layer of $Cu_6Sn_5$ and $Cu_3Sn$. This duplex layer is less absorptive of laser energy than free tin and can thus degrade subsequent laser bonding. Likewise, it has been found that electrodeposited tin maintained at less than 13° C. will transform from the white (beta) tin of tetragonal form to the gray (alpha) tin of cubic centered form. As a result the specific gravity of the tin is lowered from about 7.3 to about 5.75 and the metallic properties of the tin are destroyed. As "tin pest" develops, a loose tin powder is formed which can easily separate from the base metal. The base metal accordingly becomes susceptible to the effects of corrosion.

Furthermore, tin-whisker metal filaments sometimes grow spontaneously from tin coatings which can form electrical shorts across electrical conductors with fine line definitions. The mechanism of tin whisker growth is not well understood, and the filaments may grow within days or several years after the tin is coated. Several approaches to control tin whisker growth have been suggested, such as short storage times, whisker inhibiting additions to the tin coating solutions, and reducing the amount of hydrogen absorbed in the plating metal by ultrasonic agitation of the plating solution and/or alternating the polarity of the electrodes during plating. Gold-tin eutectic solder has many desirable attributes, such as good wetting of gold plated surfaces, high tensile strength, good fillet formation, long shelf life, high resistance to chemical attack and corrosion, and a relatively wide tolerance for temperature and pressure variations. Moreover, the negative aspects of tin coating such as tin pest and whisker growth do not appear. Thus, a gold-tin solder may have the advantageous properties of pure gold-to-gold bonding.

In view of the above, there exists a need for laser bonding microelectronic electrical members such as high density TAB tape leads to pads or bumps on integrated circuits or substrates in a gold-to-gold contact environment that overcomes the drawbacks commonly associated with tin coatings.

SUMMARY OF THE INVENTION

One of the features of the present invention is to provide the most appropriate laser technology for bonding. The present invention is also directed to the use of particular metal combinations for the electrical members to be bonded together and the laser characteristics which optimize the adhesion between the members and produce stronger bonds.

The present invention is directed to a method of bonding a first highly reflective metallic electrical member to a second highly reflective metallic electrical member by a laser, and includes coating a member with a coupling material that is well absorbent to the laser energy at the wavelength of the laser, has a lower melting point than either of the members, and has a low solubility in a solid alloy of the members, aligning the members with the coating therebetween, holding the members in contact with the coating to form an interface, and bonding the members at the interface by applying a laser beam, wherein the laser characteristics are selected so that as an alloy of the members solidifies a solidification front will drive the molten coating and molten compounds containing the coating away from the bond interface toward the periphery of the bond, wherein substantially all of the solidified bond interface consists of an alloy of the electrical members and wherein substantially all of the bond interface strength results from an alloy of the electrical members.

An object of the present invention is to produce a single phase copper/gold alloy, such as 20% copper and 80% gold, at the center of the bond interface between a copper member coated with tin and a gold member, wherein a molten ternary compound of copper/gold/tin is formed by heat from the laser. When the laser is no longer applied the temperature decreases and at 891° C. a copper/gold alloy solidifies at the bond interface, and a solidification front of the copper/gold alloy drives the molten tin and tin compounds away from the bond interface towards the exterior periphery of the bond. When the temperature further decreases to the range of 252° C. to 451° C., various tin intermetallic compounds solidify exterior to the bond so that substantially all of the bond interface is composed of the copper/gold alloy. The resulting bond interface is essentially free of brittle tin intermetallics and therefore highly reliable.

Still another object of the present invention is a method wherein a first electrical member is coated with a coating alloy consisting of (i) a metal which is the same as the metal of the second electrical member, and (ii) a coupling material that is well absorbent to the laser energy at the wavelength of the laser, has a lower melting point than either of the electrical members, and has a low solubility in a solid bond alloy of the metal and the first and second electrical members, aligning the first and second electrical members with the coating alloy therebetween, holding the first and second electrical members in contact with the coating alloy to form an interface, and bonding the first and second members at the interface by applying a laser beam, wherein the laser characteristics are selected so that as the bond alloy solidifies a solidification front will drive the molten coupling material and molten compounds containing the coupling material away from the bond interface toward the exterior periphery of the bond, wherein substantially all of the solidified bond interface consists of the bond alloy, and wherein substantially all of the bond interface strength results from the bond alloy.

A still further object of the present invention is wherein the first member is copper, the coating alloy coating the first electrical member consists of tin and gold, and the second electrical member is gold. This provides for gold-to-gold laser bonding.

Another object of the present invention is wherein the first and second electrical members are bonded together by a pulsed YAG laser in which the laser beam has a a pulsewidth of 4-8 milliseconds, an energy output of 50-200 millijoules, and has a wavelength of 1.064 microns.

Still a further object of the present invention is to provide for laser TAB tape inner lead bonding to an integrated circuit and outer lead bonding to a substrate.

Other and further objects, features and advantages will be apparent from the following description of presently preferred embodiments of the invention, given for the purpose of disclosure, and taken in conjunction with the accompanying drawings.

DESCRIPTION OF THE PREFERRED EMBODIMENT

While the present invention will be described for purposes of illustration only by the laser bonding of gold/tin coated copper tape-automated-bonding (TAB) lead frames to gold bumps on integrated circuits, the present method for laser bonding is applicable to bonding other types of highly reflective metallic electrical members to each other.

The present laser bonding method requires that prior to bonding the electrical members be aligned and brought in intimate contact to form an interface. The details of alignment and intimate contact are well known and are not provided herein. U.S. Pat. No. 4,845,335 describes these details for bonding TAB inner leads to integrated circuit bumps in a production oriented system capable of bonding rates in excess of 200 bonds per second, with small leads (less than 50 microns) on close pitches (less than 100 microns). U.S. Pat. No. 4,845,335 is hereby incorporated by reference.

Figure 1:
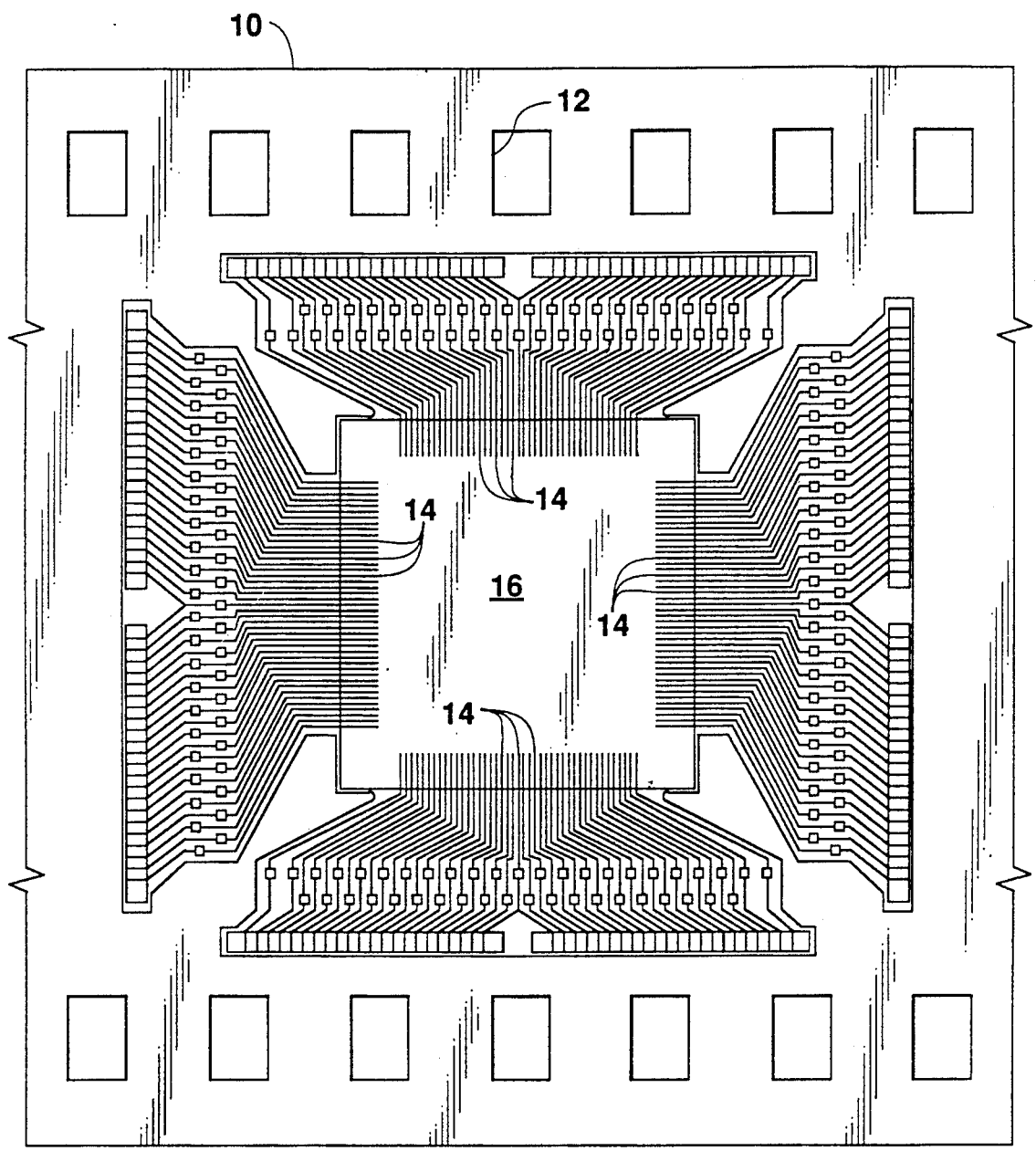
FIG. 1 is a fragmentary enlarged elevational view of a TAB tape with an integrated circuit die in place for bonding.

Referring now to the drawings, and particularly to FIG. 1, the reference numeral 10 generally indicates a portion of a tape automated bonding tape (TAB) having the usual sprocket holes 12 and plurality of highly reflective metallic first electrical members, shown as inner leads 14 for bonding to an integrated circuit die 16 having active semiconductor circuitry.

Current industry standards for TAB inner lead bonding use conventional thermocompression bonding with high pressures and temperatures (currently 15,000 psi and 400° C.) which is acceptable for bonding leads located over bare silicon. Conventional thermocompression bonding is not suitable for bonding over semiconductor structures. However, it would be advantageous to locate the bonding bumps over active circuitry to allow reduction in the cost of the assembled integrated circuits and improve performance by reducing signal path lengths. Furthermore, the yield and reliability of bonds over bare silicon can be increased by greatly reducing heat and pressure.

Figure 2:
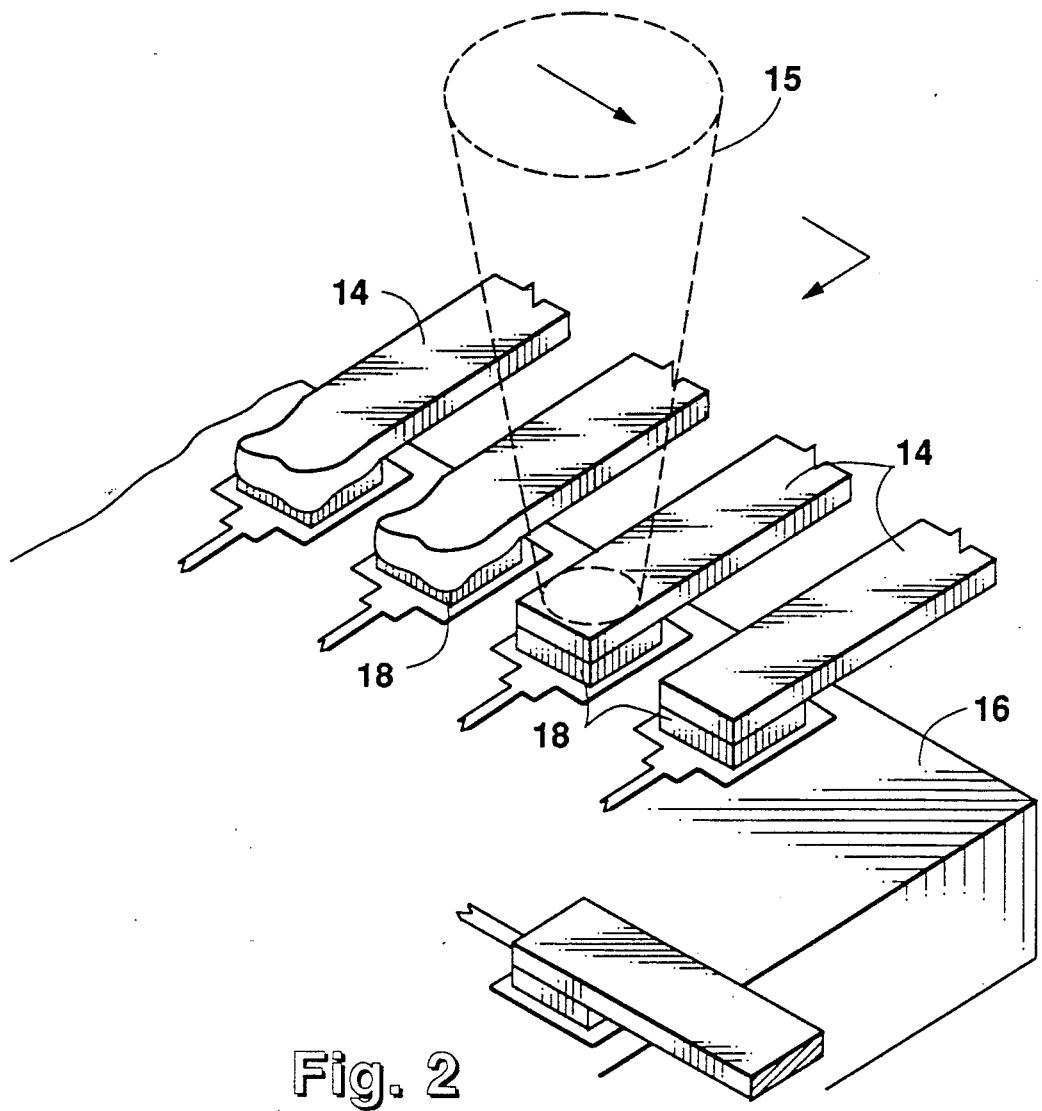
FIG. 2 is a fragmentary perspective view of a laser beam bonding the inner leads of a TAB tape to the bumps on an integrated circuit die.

Thus, the present invention is advantageous by using laser bonding, where a localized, concentrated heating source, a laser beam 15, is used to bond the inner leads 14 to the highly reflective metallic second electrical members, shown as bumps 18 on an integrated circuit die 16, as seen in FIG. 2. In a typical lead-bump connection, the bumps are square bumps 25 microns thick with each side approximately 4.4 mils long. The leads 14 are 1.3 mils thick and 3 mils wide.

The first problem considered is the appropriate laser technologies for bonding the leads 14 to the bumps 18. $CO_2$ lasers have a wavelength of 10.6 microns. Such laser energy is better absorbed by a heat transfer medium such as flux than the metal electrical contacts 14 and 18. However, due to its longer wavelength, a $CO_2$ laser cannot be focused to a small enough spot for bonding the lead 14 and bump 18 and were therefore excluded from consideration.

Since the integrated circuit 16 uses aluminum as a conductor material, and the base material for the leads 14 and bumps 18 are copper and gold, lasers in the spectrum between 0.2 and 0.3 microns wavelength were considered. At these wavelengths energy is well absorbed by the leads 14 and bumps 18 while reflected by the underlying aluminum structures. In this spectrum, excimer lasers were tested. However, it was found that their radiation was so well absorbed that it ablated the molecular bonds rather than merely vibrating them to cause melting and therefore these lasers were rejected.

YAG lasers are solid state lasers with an output that is either continuous wave (CW), shuttered with an acoustical-optic or electro-optic device (Q-switch), or pulsed. They have a wavelength of 1.064 microns. The laser output power as a function of time is different for each of the YAG lasers. It was discovered that these differences have a profound effect upon the suitability of the laser for bonding. A Q-switch laser permits lasing only when the Q-switch is open and there is a kilowatt power spike of several nanoseconds duration at the beginning of each pulse which is capable of drilling a deep small diameter hole in the bond site. As such the Q-switch laser tends to ablate material rather than melt, it, as is useful for cutting and drilling but not bonding. The CW laser took considerably more energy to melt the bumps than the Q-switch laser. When enough CW laser power was applied to initiate melting, however, the pulse width could not be sufficiently controlled to prevent damage to the surrounding integrated circuit.

Figure 3:
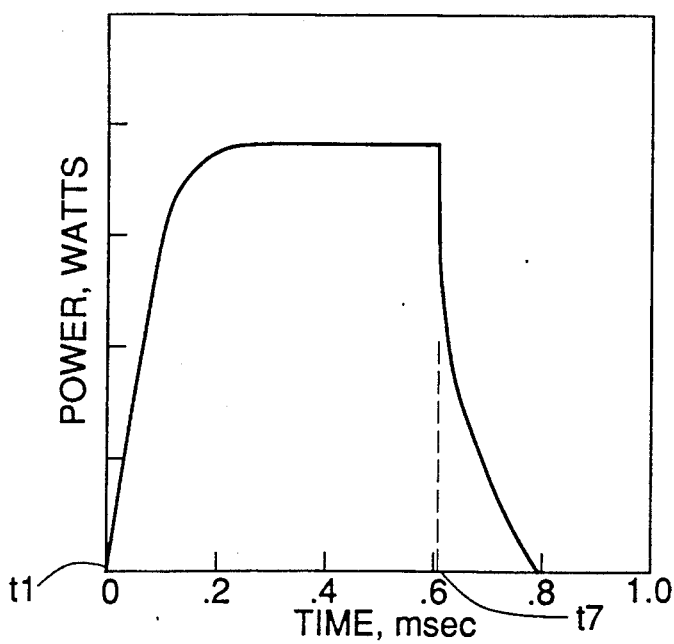
FIG. 3 is a graph showing the wave form of a pulsed YAG laser.

The best test results have been obtained using the pulsed YAG laser. The power versus time curve for a pulsed laser is shown in FIG. 3. In a pulsed laser the flashed lamps are turned on and off for each pulse. As a result, there is an exponential increase in power output until a maximum level is reached at which point the power exponentially decreases. With a pulsed laser, the metals to be bonded are heated to a maximum temperature at which time the energy input exponentially decreases. The pulsed laser provides a higher power level at the middle of the pulse than the Q-switch laser. However, the peak power is orders of magnitude less than the spike at the beginning of the Q-switch pulse. This power preheats the bond site and provides the bond site with the most power when it can use it most efficiently. It also provides decreasing power which tends to allow less internal stress buildup than the instantaneous drop-off of energy that is characteristic of the Q-switch or CW laser. The pulsed YAG laser pulse width was short enough to allow bonding without damaging the surrounding integrated circuit. It was found that a 50 watt average power pulse YAG laser made by Carl Haas GmbH and Co. was satisfactory. It was fitted to a model 44 laser trimmer with linear motor beam positioning equipment from Electro Scientific Industries.

Another factor to be considered in the bonding of the leads 14 to the bumps 18 is the types of materials used. Experiments with a number of lead finishes and bump metallurgies have been performed. It has been found that it is desirable to provide coatings which highly absorb laser energy at the wavelength of the laser used and which have a low solubility in the solid alloy of the leads 14 and bumps 18. Also, since the best electrical conductors, such as copper, gold, silver, and nickel, are highly reflective of light, it is desirable to use highly reflective metallic electrical members. For a YAG laser with a 1.064 micron wavelength, a suitable first electrical member contains a high degree of copper (1.4% energy absorption), a suitable second electrical member contains a high degree of gold (1.5% energy absorption), and a suitable coupling material for coating the first electrical member contains a high degree of tin (53.6% energy absorption).

The amount of free tin on the lead also has a direct bearing on the bondability of the lead. When tin is plated on the leads, initially all of the tin is pure, free tin. Over time, the free tin reacts in the solid state with the copper to form a copper/tin compound such as $Cu_6/Sn_5$. The longer the tape sits, the thicker the copper/tin compound and the thinner the free tin layer becomes. While the copper/tin compound has a much higher melting point than that of free tin, it is still considerably lower than the melting point of elemental gold and copper so that it also contributes to the bonding phenomenon described above. However, if the free tin layer is too thin, not enough tin is present to absorb the radiation and initiate an efficient melting/heat transfer process. Experiments show that three micro-inches of free tin is adequate to achieve satisfactory bonds to gold bumps. Experiments have also shown that if the leads are plated with at least twelve micro-inches of electroless tin, the tapes can be stored in a dry box for over two months before a detrimental amount of copper/tin compound is formed.

Most of the bonding experiments were performed using tin plated copper leads over gold bumps. However, experiments with other material combinations have also been performed. For these experiments, leads were either bare copper or copper electroplated with tin, silver, gold, zinc, nickel or indium. All leads were bonded to either gold or copper bumps. With the exception of zinc all of the lead materials bonded to bumps were made from other materials. Zinc has high enough vapor pressure that it boils away before it can flow between the lead and bump to promote heat transfer. Indium, on the other hand, like tin, has a low melting point and a low vapor pressure at its melting point. Bonds that were made with indium plated leads are very similar in appearance to those made with tin plating. Other suitable coatings include gallium, germanium, and mixtures of tin, indium, gallium and germanium. Additionally, if desired, a suitable coating can be alloyed with cadmium, bismuth, or lead to lower the melting point.

Figure 4A:
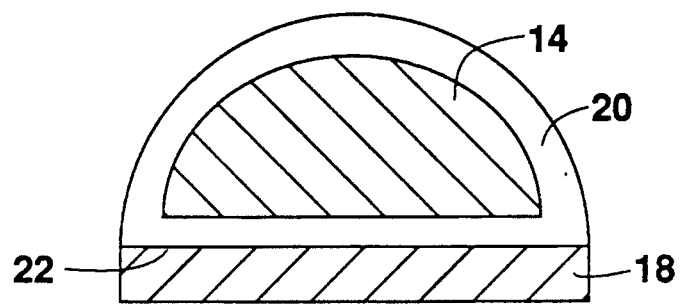
FIG. 4A is a cross-sectional view of a bond site with a lead coated with a coupling material in contact with a bump prior to laser bonding.

Referring now to FIG. 4A, a cross-sectional view of a bond site shows lead 14 coated with a coating 20 aligned and positioned in intimate contact with bump 18 before laser beam 15 is applied.

Figure 4B:
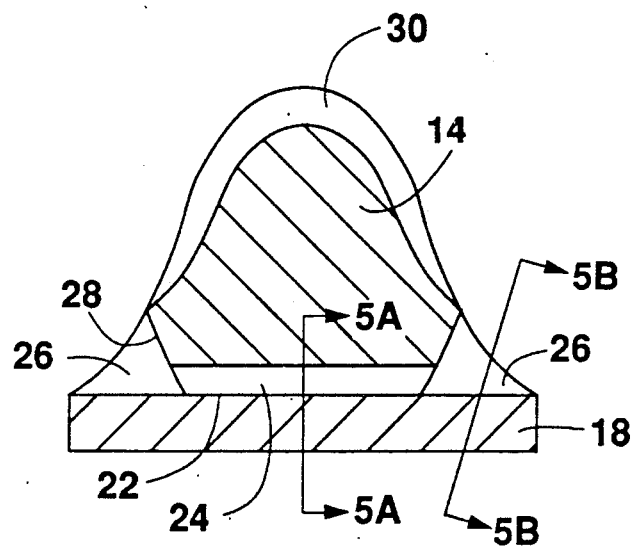
FIG. 4B is a cross-sectional view similar to FIG. 4A showing the bond site, after laser bonding has occurred.

Referring now to FIG. 4B, a cross-sectional view of the bond site in FIG. 4A is shown after laser beam 15 has been applied. The uniform interface 22 between lead 14 and bump 18 consists of an alloy 24 throughout the body of the bond formed from the lead 14 and bump 18 with essentially no material from coating 20, as well as an alloy 26 along the periphery of interface 22 and the outer edge 28 of lead 14 which contains a substantial amount of coating 20. In other words, substantially all of bond interface 22 consisted of alloy 24. An additional alloy 30 containing material from lead 14 and coating 20 may solidify along lead exterior 28 away from interface 22. The highest bonding yields have been obtained when copper leads 14 coated with nominal 25 microinches of emersion (i.e. electroless) tin 20 were bonded to gold bumps 18. A cross-sectional examination of the bonds indicated that there was a void-free, uniform interface 22 between the lead 14 and the bump 18. An electron microscope scan taken along the interface 22 indicates regions of constant composition indicating the presence of homogenous copper/gold alloys 24 containing no tin intermetallics.

Figure 5A:
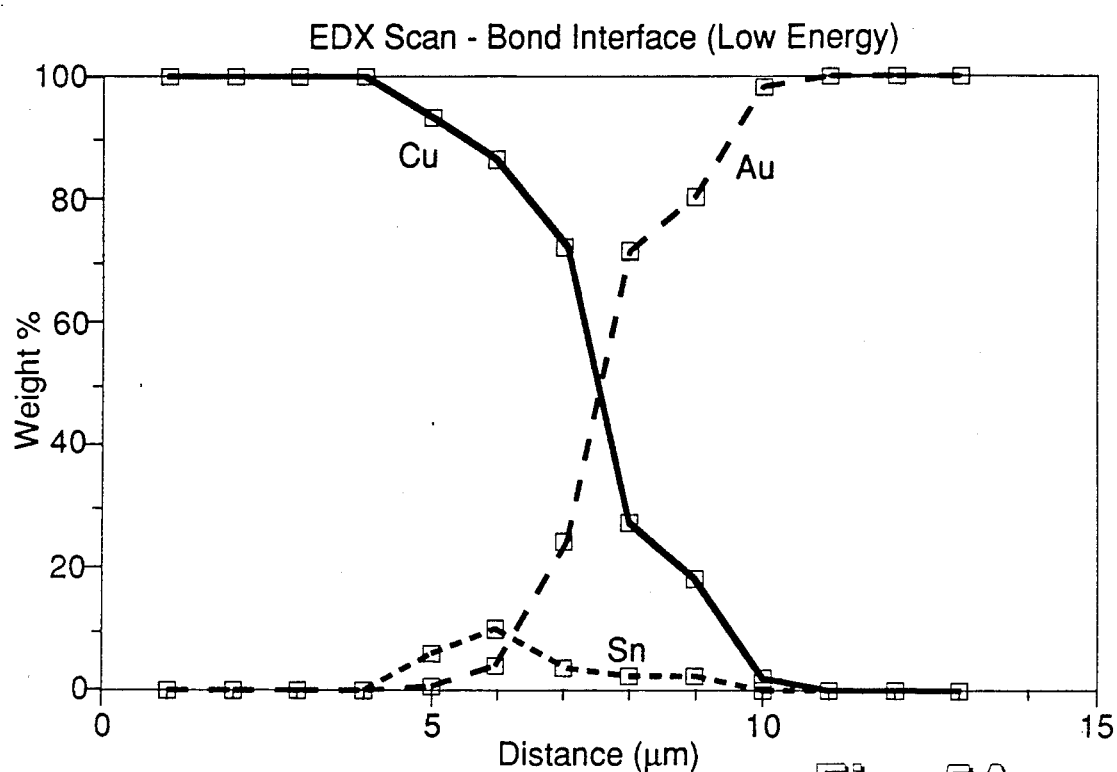
FIG. 5A is an energy dispersive X-ray plot taken along line 5A—5A in FIG. 4B showing the distribution of elements along substantially all of the bond interface.

Referring now to FIG. 5A, the EDX line scans taken along line 5A—5A in FIG. 4B are indicative of substantially all of bond interface 22 and reveal that alloy 24 primarily contains 20% copper and 80% gold, which is the lowest melting point copper/gold solid solution. No significant amount of tin coating 20 was found in the non-peripheral regions of bond interface 22. The steep slopes of the copper and gold curves indicate the narrow region of bond interface 22. This is especially important for high reliability usage in which even small regions of tin intermetallics throughout the bond site, for instance 0.5 to 1.5 microns, are unacceptable since tin intermetallics provide potential fracture paths under stressful conditions such as thermal or mechanical cycling or shock.

Figure 5B:
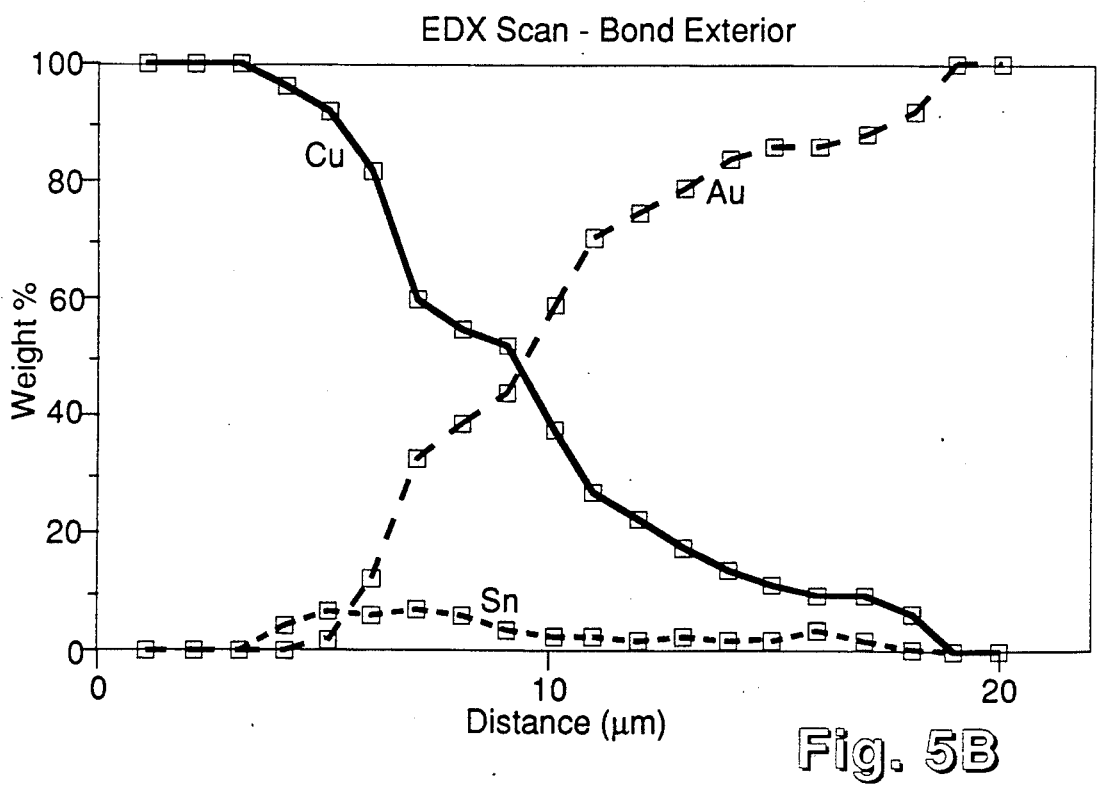
FIG. 5B is an energy dispersive X-ray plot taken along line 5B—5B in FIG. 4B showing the distribution of elements along the exterior periphery of the bond interface.

Referring now to FIG. 5B, the EDX line scans taken along line 5B—5B in FIG. 4B are indicative of the exterior periphery of bond interface 22 and reveal the presence of a higher concentration of potentially brittle tertiary solid solution of copper, gold and tin. The shallow slopes of the scans indicate a broader region of ternary solution than copper/gold alloy 24.

Figure 6:
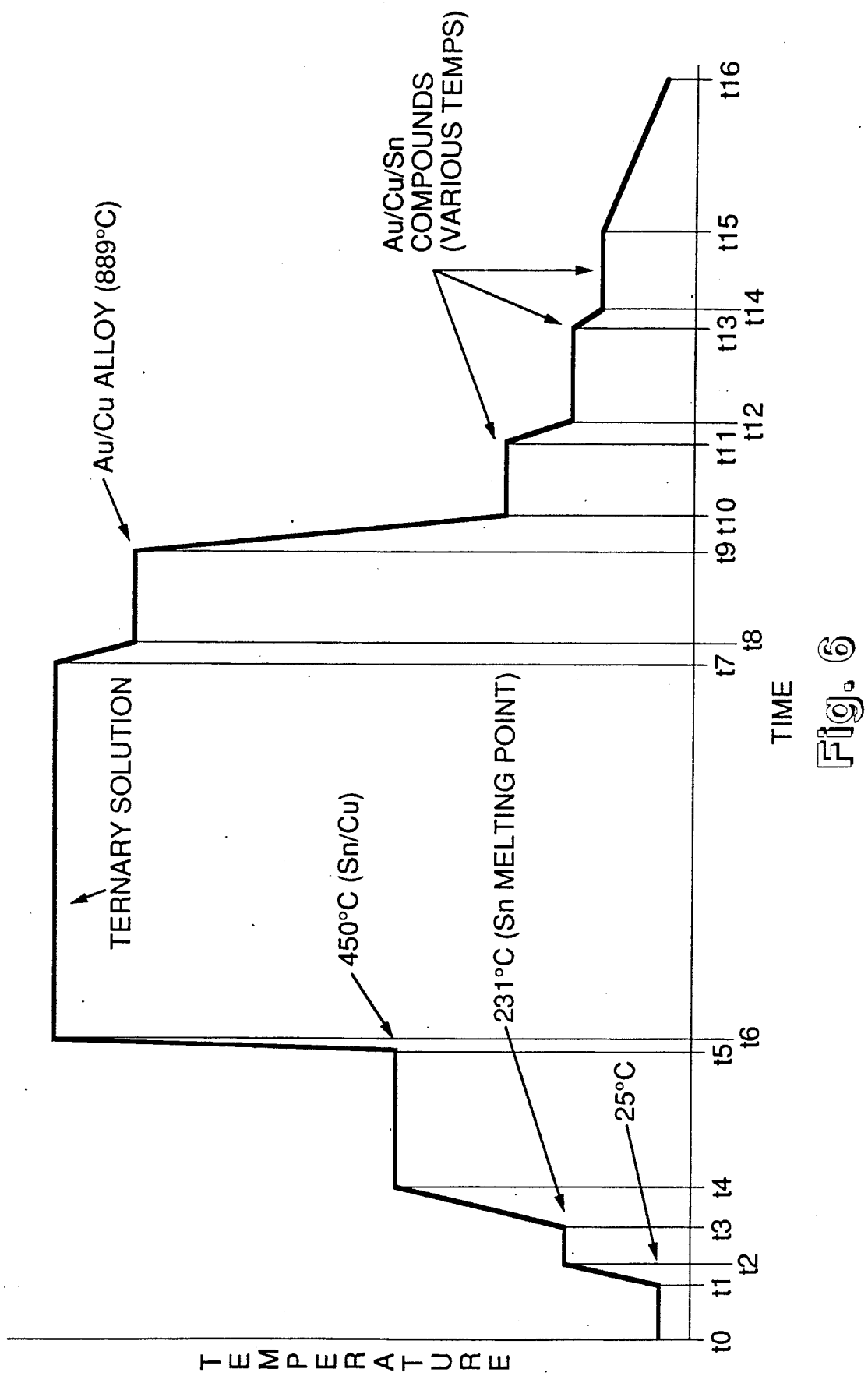
FIG. 6 is a postulated time-temperature relationship of the intermetallic reactions of one embodiment during bond formation.

Referring now to FIG. 6, a postulated time-temperature relationship of intermetallic reactions during a bond formation is shown. At time t0 the bond site is inactive at room temperature. At time t1 the laser beam is applied and the bond site temperature increases. At time t2 the temperature reaches 231° C. and the tin begins to melt. The tin absorbs a high percentage of the incident laser energy, but due to its low vapor pressure does not evaporate. Rather, the molten tin enhances thermal coupling at the bond interface. The tin will later produce intermetallic phases with the copper and the gold. These intermetallic compounds, once formed, melt at a temperature below the melting points of the copper or gold in independent states. This continues until time t3 when all the tin has melted and the temperature rises again. At time t4 a copper/tin alloy begins to form at 450° C: until time t5, when again the temperature rises. At time t6, when the temperature exceeds 889° C., a molten ternary compound containing copper, gold, and tin is formed throughout the bond interface. At time t7, as also shown in FIG. 3, the laser beam is no longer applied to the bond site, and the temperature begins to decrease. At time t8 the temperature drops to 889° C. and a gold/copper 24 alloy begins to solidify near the center of the bond. An advancing solidification front of the gold/copper alloy 24 then extends outwardly toward the periphery of the bond. Since the solubility of the tin in the solid copper/gold alloy is low, the tin is constrained in the still liquid phase, and therefore the solidification front drives the molten tin and molten tin compounds away from the bond interface toward the exterior periphery of the bond. This results in the tin intermetallics solidifying on the exterior periphery of the bond interface, and substantially all of the bond interface 22 containing a copper/gold alloy 24. At time t9 the temperature further decreases until time t10 when the temperature reaches 451° C. Thereafter between times t10 and t15 when the temperature is in the range of 252° C. to 451° C., successive layers of various tin intermetallic compounds, such as $Cu_3Sn$, $Cu_5AuSn_5$, $Cu_4Au_2Sn_5$, $Cu_3Au_3Sn_5$, and $AuSn_4$, will solidify at the exterior periphery of the bond interface 22. For instance, at t10 a first gold/copper/tin alloy solidifies in the range of 252° to 451° C. At time t11 the temperature further decreases until time t12 when a second gold/copper/tin alloy solidifies in the range 252° C. to 451° C. Similarly at time t13 the temperature decreases again until time t14 when a third gold/copper/tin alloy solidifies in the range of 252° C. to 451° C. Finally at time t15 the temperature further decreases until the bond site reaches room temperature at time t16. It is noted that as the final bond is formed, substantially all of the bond interface strength results from copper/gold alloy 24, with little or no bond strength resulting from tin or tin intermetallics.

After the laser bonding process was developed, consistent, high yield bonds were made. Samples were bonded and subjected to severe environmental testing to access the long term reliability of the process. Most of the environmental tests were performed in accordance with MIL-STD-883 and are summarized in table 1:

TABLE 1

| TEST | ENVIRONMENT | DURATION |
|---|---|---|
| autoclave | 121° C., 100% R.H., 15 psig | 96 hours |
| high temp. storage | 150° C. | 1000 hours |

TABLE 1-continued

| TEST | ENVIRONMENT | DURATION |
| --- | --- | --- |
| 85/85 moisture resistance | 85° C., 85% R.H. | 1000 hours |
| | −10° C. at 2.7% R.H. to 65° C. at 95% R.H. | 50 cycles |
| liquid-to-liquid temperature shock | −55° C. to 125° C. | 1000 cycles |
| air-to-air temperature shock | −55° C. to 125° C. | 1000 cycles |

The devices were removed from the environments at periodic intervals and electrically tested. There were no failures of the devices at any of the intervals. After environmental testing was complete, the leads were then pull tested. The data indicated that the entire bond structure remained strong after exposure to the severe environments.

In the above described embodiment of the present invention, the first electrical member is coated with a coupling material that is well absorbent to the laser energy at the wavelength of the laser, has a lower melting point than either of the electrical members, and has a low solubility in a solid alloy of the electrical members. However, this should be taken by way of example and not by way of limitation, inasmuch as substantially the same effect can be achieved by coating the first electrical member with a coating alloy containing the coupling material and a metal which is the same as the metal of the second electrical member. It is understood that any technical matters in conjunction with coating the first electrical member with a coupling material can be equally applied to coating the first electrical member with a coating alloy of the coupling material and the metal of the second member. Hence, any description in conjunction with the coating of the coupling material is incorporated in the coating of the coating alloy insofar as the same is applicable, and the same description is not repeated.

Figure 7A:
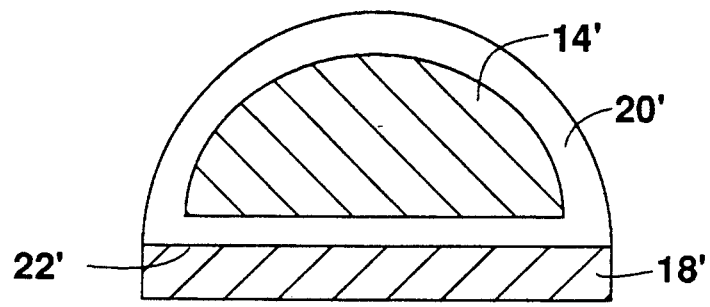
FIG. 7A is a cross-sectional view of a bond site similar to FIG. 4A with a lead coated with a coating alloy, consisting of (i) a coupling material and (ii) a metal the same as a bump, in contact with a bump prior to laser bonding.
Figure 7B:
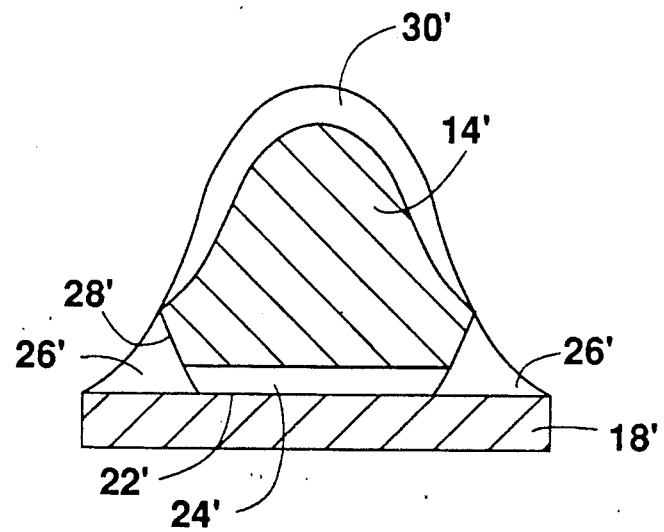
FIG. 7B is a cross-sectional view similar to FIG. 7A showing the bond site after laser bonding has occurred.

Referring now to FIG. 7A, a cross-sectional view of a bond site shows a first electrical member such as copper TAB lead 14' coated with a coating alloy 20' which, for example, can contain 90% gold metal and 10% tin coupling material wherein at least 65% gold and at most 35% tin is preferred. Coating alloy 20' can be evaporated on lead 14' or applied by other conventional deposition techniques as electroplating and the like. Coated lead 14' is aligned with and positioned in intimate contact with the second electrical member shown as gold bump 18' with gold/tin coating alloy 20' therebetween. Thereafter a laser beam 15 can be applied to the bond, such as a pulsed 1.064 micron YAG laser in the time control mode with a pulse width in the range of 4-8 milliseconds and a laser energy in the range of 50-200 millijoules. While these ranges can produce a satisfactory bond, a pulse width in the range of 4-6 milliseconds and a laser energy in the range of 50-100 millijoules is preferred. Consequently, as shown in FIG. 7B, a uniform interface 22, between lead 14' and bump 18' consists of bonding alloy 24', wherein substantially all of bonding alloy 24' (i.e. 99% to 99.5%) consists of copper and gold and substantially all of the tin and tin intermetallics are driven to the exterior periphery of the bond thereby contributing little or no strength to the resultant bond. Moreover, the insubstantial amount of tin (i.e. 0.5% to 1%) that remains in bond alloy 24' is randomly distributed throughout bond alloy 24' and, thus, is insignificant for practical purposes since no appreciable tin intermetallics will form. Sample bonds were destructively tested by stressing the leads with a probe under a microscope. Most of the bonds broke in span indicating high reliability bonds. Coating lead 14' with gold/tin alloy 20' instead of coating lead 14 only with tin 20 is a more difficult process since the composition as well as the thickness must be controlled; however, the highly advantageous aspects of pure gold-to-gold bonding are gained by eliminating the drawbacks of tin-whisker growth and tin intermetallics such as gold/tin and copper/tin compounds which can limit the shelf life of a tin plated TAB tape as previously described.

The present invention will be further illustrated by the following examples. These examples are meant to illustrate and not to limit the invention, the scope of which is defined solely by the appended claims.

EXAMPLE 1

Figure 8A:
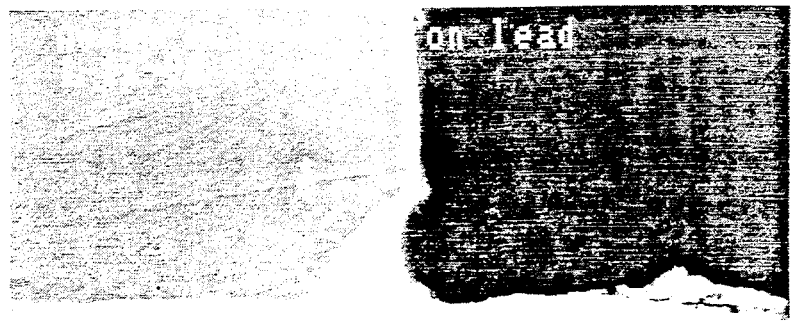
FIGS. 8A-8C are photomicrographs of bonds formed by evaporating gold/tin over copper leads and thereafter laser bonding the leads to gold bumps in accordance with the present invention.
Figure 8B:
Figure 8C:
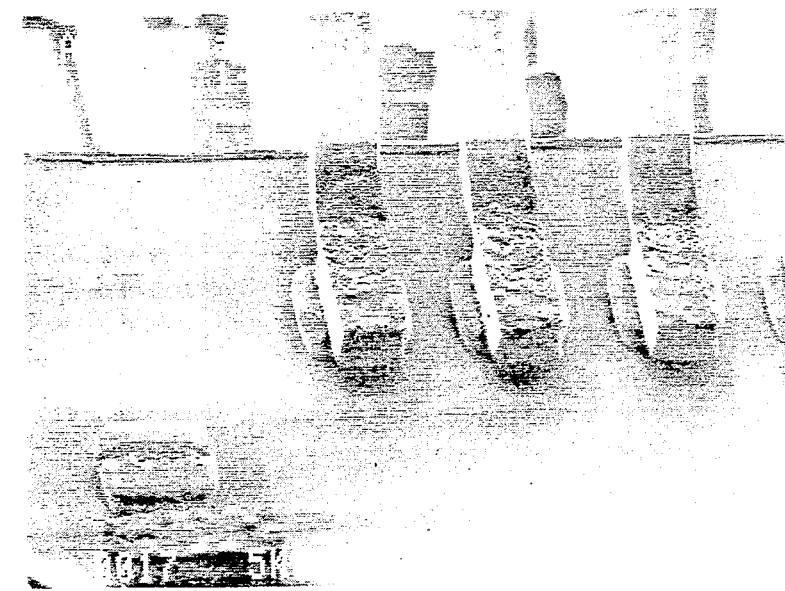

An alloy of 80% gold and 20% tin was evaporated onto the circuit and polyimide sides of 2-layer electro-deposited copper tape frames. After evaporation the composition of the alloy was approximately 90% gold and 10% tin. An integrated circuit die was aligned to the tape leads and the leads were held in contact with bumps on the die using a coverglass. A vacuum of about 20 inches mercury was used to clamp the leads against the bumps. Next a 1.064 micron YAG laser beam focused with a 28 mm f3.0 objective lense was used to bond the leads to the bumps. The focused spot eye was within 1 mil of the best focus. Individual pulses of 6.0 milliseconds duration with a capacitor voltage of 350 volts produced 160 millijoule pulses. Two samples were bonded. After bonding, the samples were pull tested resulting in a large percentage of the leads breaking, indicating the bonds were stronger then the copper leads. Bonds formed in accordance with example 1 are shown in FIGS. 8A-8C.

EXAMPLE 2

Figure 9A:
FIGS. 9A-9B are photomicrographs of bonds formed by electroplating gold/tin over copper leads and thereafter laser bonding the leads to gold bumps in accordance with the present invention.
Figure 9B:
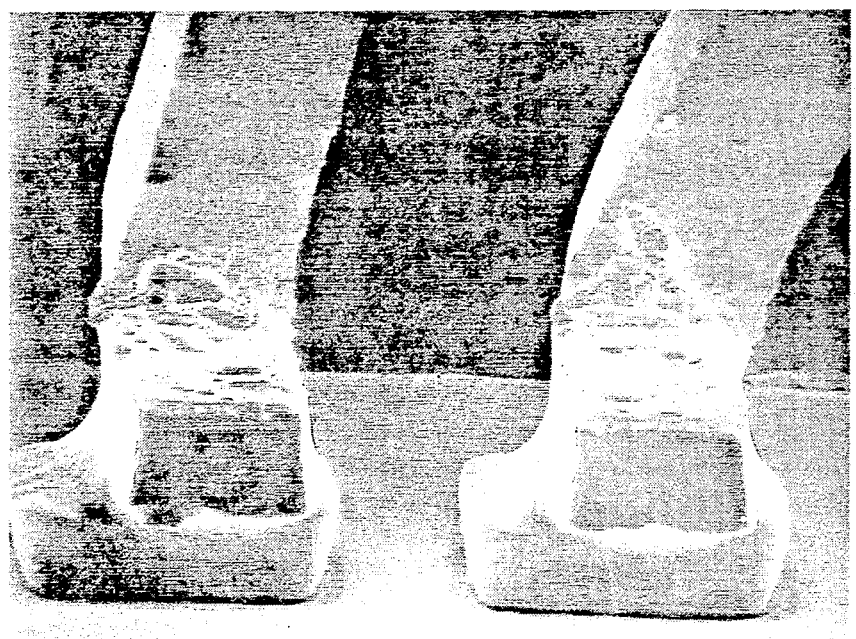

Six additional samples were prepared using the 2-layer electro-deposited copper tape frames similar to example 1 except the gold/tin coating was electroplated rather than evaporated. A commercial gold/tin solution modified with additional tin was plated with 25mA current for 5 minutes. The samples were aligned and clamped in the same way as the samples in example 1. A laser was used with the same parameters as example 1 except the individual pulse durations were 5.0 milliseconds which produced 130 millijoule pulses. Bond pull results were similar to example 1. Bonds formed in accordance with example 2 are shown in FIGS. 9A-9B.

The present invention, therefore, is well adapted to carry out the objects and attain the ends and advantages mentioned as well as others inherent therein. While presently preferred embodiments of the invention have been given for the purpose of disclosure, numerous changes in the details of construction, arrangement of parts, and steps of the process, will be readily apparent to those skilled in the art and which are encompassed within the spirt of the invention, and the scope of the appended claims.

What is claimed is:

1. A method of bonding a first highly reflective metallic electrical member to a second highly reflective metallic electrical member by a laser, comprising:
   coating the first electrical member with a coating alloy, comprising
      (i) a metal which is the same as the metal of the second electrical member, and (ii) a coupling material that is well absorbent to the laser energy at the wavelength of the laser, has a lower melting point than either of the electrical members, and has a low solubility in a solid bond alloy of the metal and the first and second electrical members;

aligning the first and second electrical members with the coating alloy therebetween;

holding the first and second electrical members in contact with the coating alloy to form an interface; and bonding the first and second members at the interface by applying a laser beam, wherein the laser characteristics are selected so that as the bond alloy solidified a solidification front will drive the molten coupling material and molten compounds containing the coupling material away from the bond interface toward the exterior periphery of the bond, wherein substantially all of the solidified bond interface consists of the bond alloy, and wherein substantially all of the bond interface strength results from the bond alloy.

2. The method of claim 1 wherein the coupling material is selected from the group consisting of tin, indium, gallium, germanium, and a mixture thereof.

3. The method of claim 1 wherein prior to applying the laser beam the coupling material is alloyed with a material selected from the group consisting of cadmium, bismuth, and lead in order to lower the melting point of the coating alloy.

4. The method of claim 1 wherein the laser is a pulsed YAG laser.

5. The method of claim 4 wherein the pulsed YAG laser has a pulse width in the range of 4-8 milliseconds.

6. The method of claim 5 wherein the pulsed YAG laser has laser energy in the range of 50-200 millijoules.

7. The method of claim 6 wherein the pulsed YAG laser has a wavelength of 1.064 microns.

8. The method of claim 4 wherein the coupling material is tin.

9. The method of claim 8 wherein the second electrical member is a gold bump and the metal of the coating alloy is gold.

10. The method of claim 9 wherein the coating alloy contains at least 65 percent gold and at most 35 percent tin.

11. The method of claim 10 wherein the first electrical member is copper.

12. The method of claim 11 wherein the first electrical member is a copper lead on a TAB tape.

13. The method of claim 12 wherein the pulsed YAG laser has a pulse width in the range of 4-8 milliseconds, a laser energy in the range of 50-200 millijoules, and a wavelength of 1.064 microns.

14. The method of claim 4 wherein the coupling material is selected from the group consisting of tin, indium, gallium, germanium, and a mixture thereof.

15. The method of claim 14 wherein the second electrical member is gold and the metal of the coating alloy is gold.

16. The method of claim 15 wherein the pulsed YAG laser has a pulse width in the range of 4-8 milliseconds, a laser energy in the range of 50-200 millijoules, and a wavelength of 1.064 microns.

17. The method of claim 16 wherein the coupling material is tin.

18. The method of claim 17 wherein the coating alloy contains at least 65 percent gold and at most 35 percent tin.

19. The method of claim 18 wherein the first electrical member is copper.

20. The method of claim 19 wherein the first electrical member is a copper lead on a TAB tape and the second electrical member is a gold bonding pad on an integrated circuit, thereby providing for inner lead bonding between the TAB tape and the integrated circuit.

21. The method of claim 19 wherein the first electrical member is a copper lead on a TAB tape and the second electrical member is a gold bonding pad on a substrate, thereby providing for outer lead bonding between the TAB tape and the substrate.

* * * * *